(12) United States Patent
Lee et al.

(10) Patent No.: US 8,129,741 B2
(45) Date of Patent: Mar. 6, 2012

(54) LIGHT EMITTING DIODE PACKAGE

(75) Inventors: Jin Bock Lee, Gyeonggi-do (KR); Hee Seok Park, Gyeonggi-do (KR); Hyung Kun Kim, Gyeonggi-do (KR); Young Jin Lee, Seoul (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 41 days.

(21) Appl. No.: 12/608,442

(22) Filed: Oct. 29, 2009

(65) Prior Publication Data
US 2011/0042690 A1    Feb. 24, 2011

(30) Foreign Application Priority Data
Aug. 18, 2009   (KR) .................. 10-2009-0076407

(51) Int. Cl.
| H01L 29/22 | (2006.01) |
| H01L 33/00 | (2010.01) |
| H01L 29/24 | (2006.01) |
| H01L 23/02 | (2006.01) |
| H01L 23/22 | (2006.01) |
| H01L 23/24 | (2006.01) |
| H01L 23/48 | (2006.01) |
| H01L 23/52 | (2006.01) |
| H01L 29/40 | (2006.01) |
| H01L 23/28 | (2006.01) |

(52) U.S. Cl. ......... 257/99; 257/100; 257/678; 257/687; 257/784; 257/787; 257/E23.033; 257/E23.068; 257/E21.128; 257/E23.131; 257/E33.056; 257/E33.058; 257/E33.059

(58) Field of Classification Search .............. 257/99, 257/100, 678, 687, 784, E23.033, E23.068, 257/E23.128, E23.131, E33.056, E33.058, 257/E33.059, 787
See application file for complete search history.

(56) References Cited

U.S. PATENT DOCUMENTS

| 5,998,243 A * | 12/1999 | Odashima et al. ............ 438/127 |
| 6,583,444 B2 * | 6/2003 | Fjelstad ......................... 257/82 |
| 7,923,272 B2 * | 4/2011 | Lee ................................ 438/28 |
| 2004/0084681 A1 * | 5/2004 | Roberts ........................ 257/79 |
| 2005/0073846 A1 * | 4/2005 | Takine ......................... 362/296 |
| 2005/0275091 A1 * | 12/2005 | Boyaud et al. ................ 257/731 |
| 2006/0016895 A1 * | 1/2006 | Watanabe et al. ............. 235/492 |
| 2007/0108464 A1 * | 5/2007 | Seol ............................. 257/100 |
| 2009/0108282 A1 * | 4/2009 | Matsuda et al. ............... 257/98 |
| 2009/0206358 A1 * | 8/2009 | Chen et al. .................... 257/99 |
| 2009/0224271 A1 * | 9/2009 | Seo et al. ...................... 257/98 |
| 2010/0181594 A1 * | 7/2010 | Lin et al. ....................... 257/99 |
| 2010/0258823 A1 * | 10/2010 | Son ............................... 257/89 |

FOREIGN PATENT DOCUMENTS
JP    2006-019598    1/2006

* cited by examiner

*Primary Examiner* — Ida M Soward
(74) *Attorney, Agent, or Firm* — McDermott Will & Emery LLP

(57) ABSTRACT

The present invention provides a light emitting diode package including: a package mold having a first cavity and a second cavity with a smaller size than that of the first cavity; first and second electrode pads provided on the bottom surfaces of the first cavity and the second cavity, respectively; an LED chip mounted on the first electrode pad; a wire for providing electrical connection between the LED chip and the second electrode pad; and a molding material filled within the first cavity and the second cavity.

13 Claims, 5 Drawing Sheets

[FIG. 1]
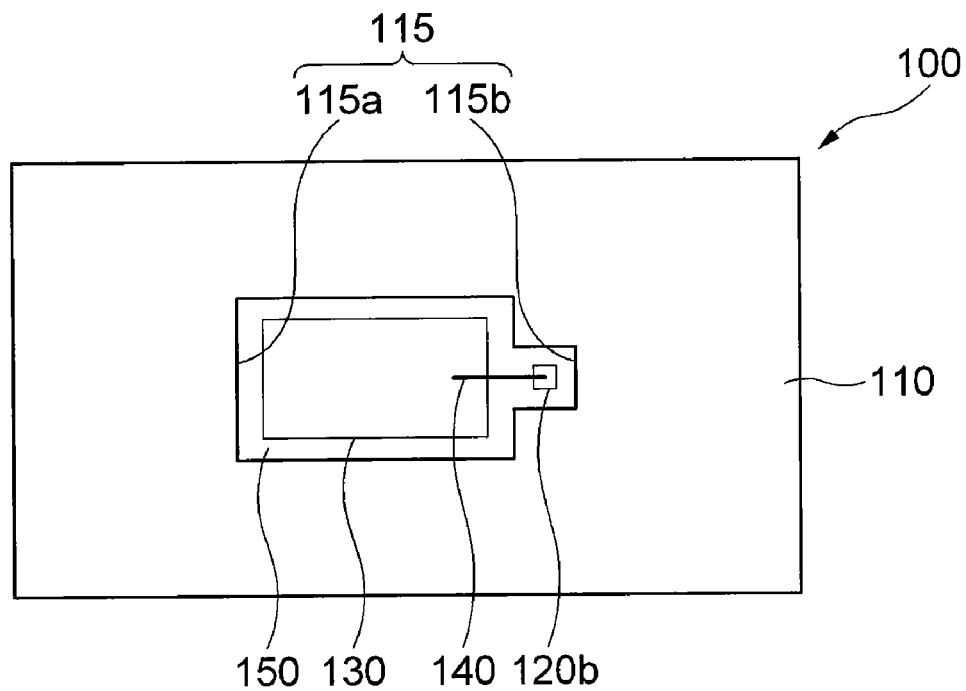
[FIG. 2]
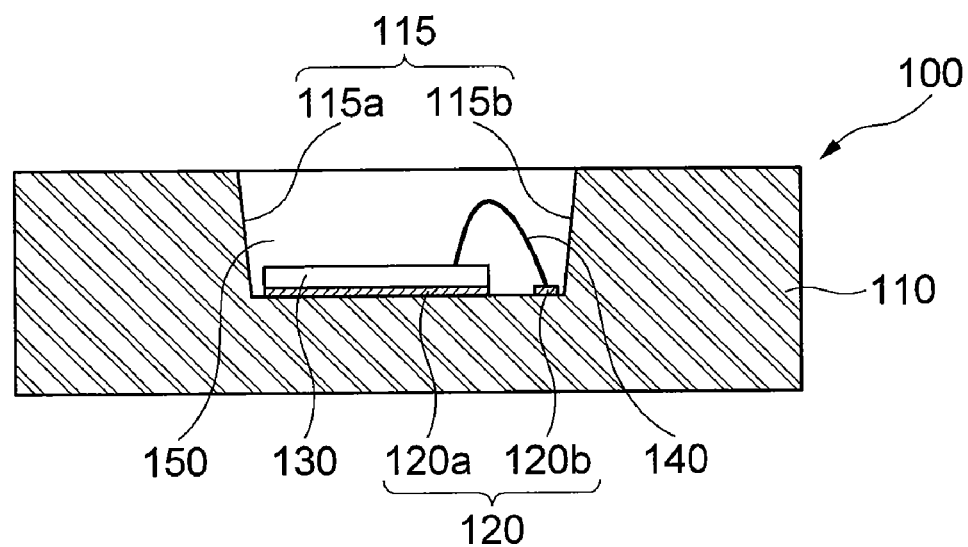

[FIG. 3]
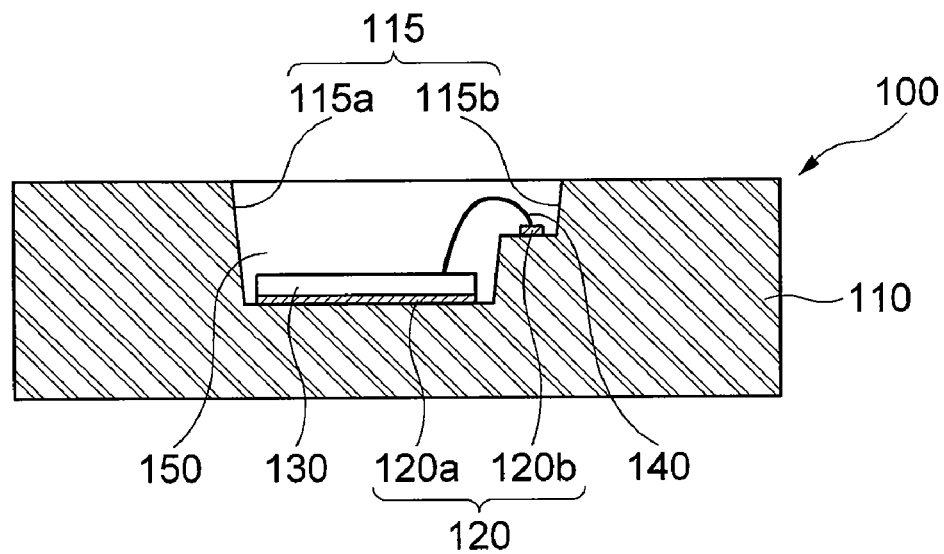
[FIG. 4]
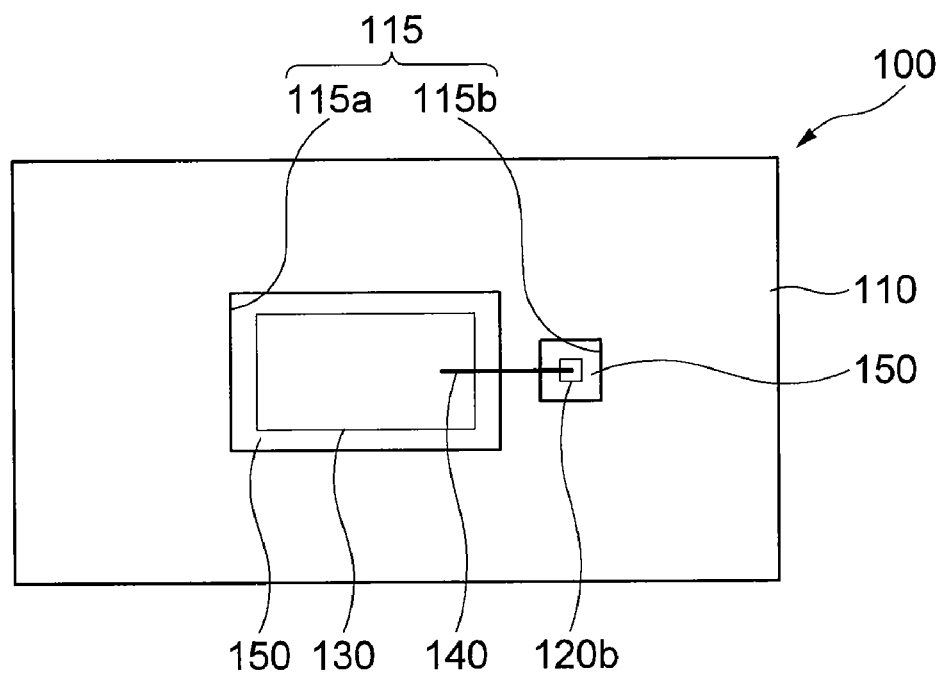

[FIG. 5]
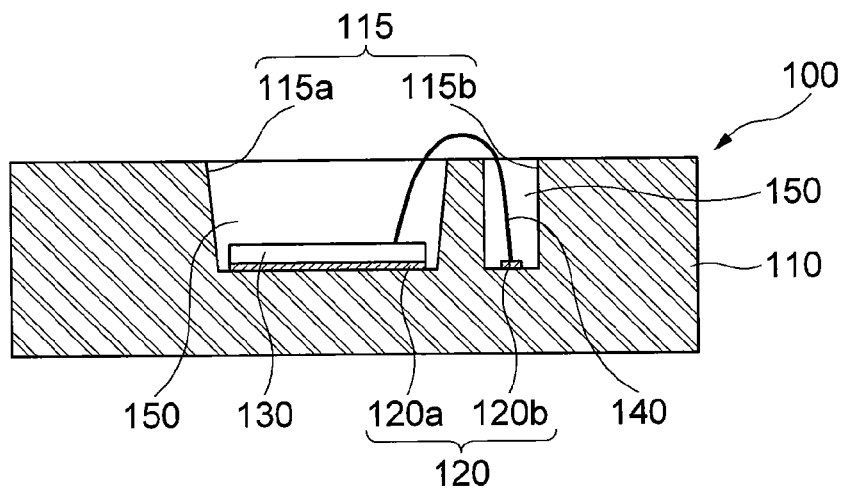
[FIG. 6]
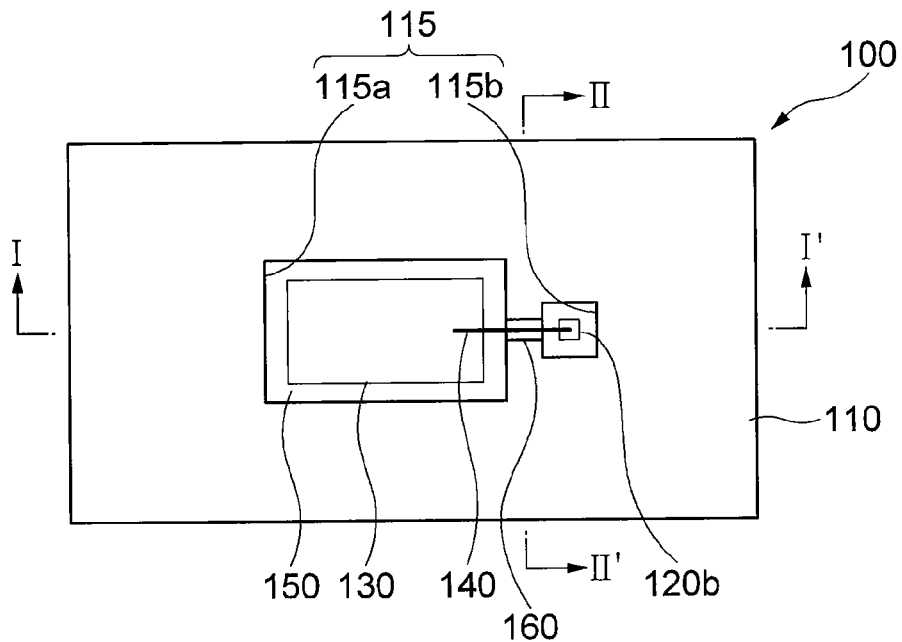

[FIG. 7]
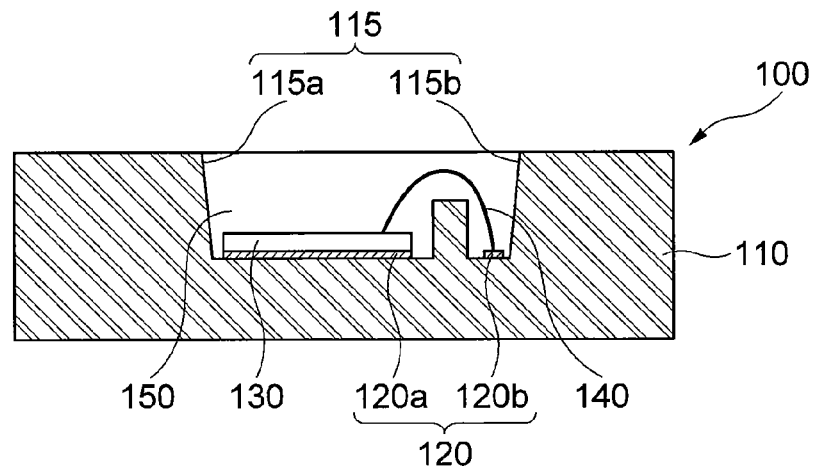
[FIG. 8]
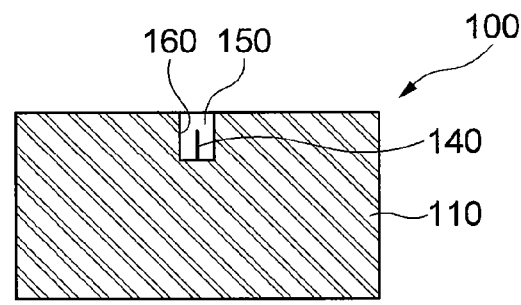
[FIG. 9]
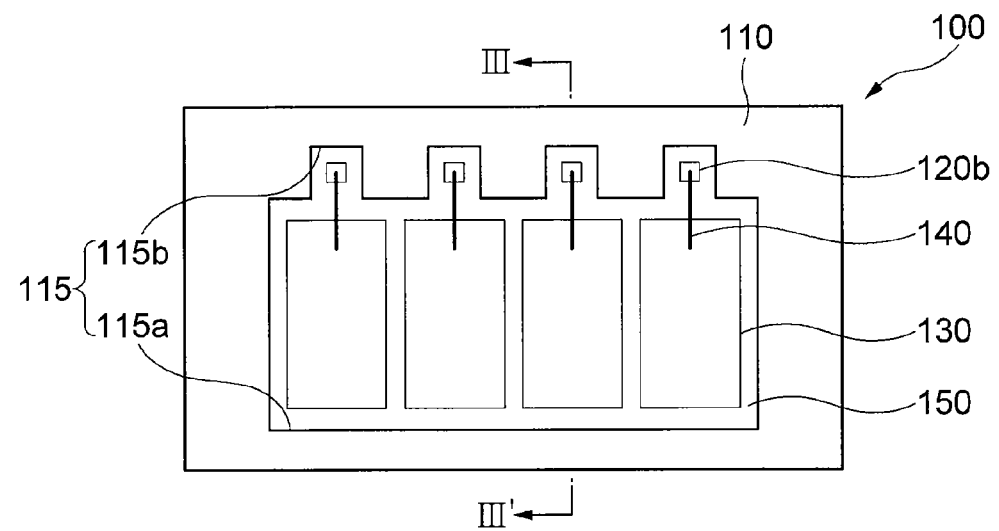

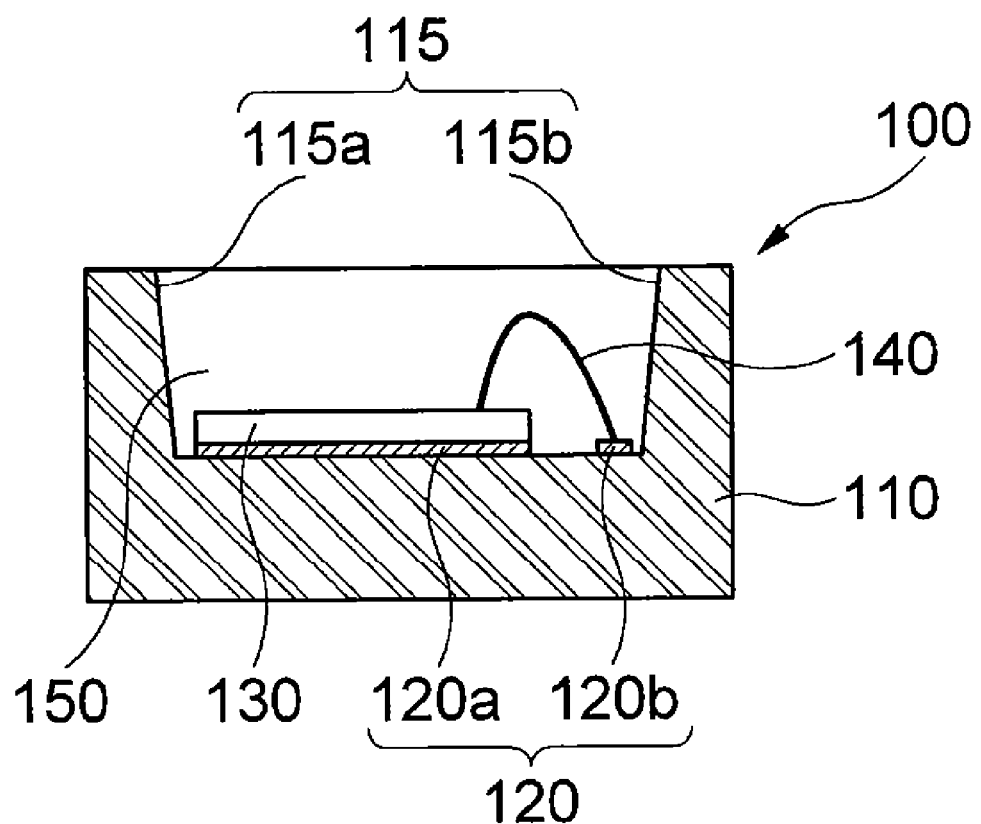
[FIG. 10]

LIGHT EMITTING DIODE PACKAGE

CROSS-REFERENCE TO RELATED APPLICATIONS

This application claims the benefit of Korean Patent Application No. 10-2009-0076407 filed with the Korea Intellectual Property Office on Aug. 18, 2009, the disclosure of which is incorporated herein by reference.

BACKGROUND OF THE INVENTION

1. Field of the Invention

The present invention relates to a light emitting diode package; and, more particularly, to a light emitting diode package for minimizing the size of a cavity in which an LED chip is mounted, thereby improving the luminance.

2. Description of the Related Art

A Light Emitting Diode (LED) refers to a semiconductor device, which can implement light beams of various colors by forming light emitting sources through change of compound semiconductor materials, such as GaAs, AlGaAs, GaN, InGaInP, and so on.

In general, factors effecting determination of characteristics of LED products include a color, luminance, light conversion efficiency, and so on. Primarily, the characteristics of the LED products are determined by compound semiconductor materials used in an LED, as a primary factor, and a package structure for mounting of the LED chip as well, as a secondary factor.

Thus, in order to develop high-luminance products meetings user's demands, much interest has been paid on the package structure since there is a limit to develop desired products only through a primary factor like material development. In particular, as the use range of the LED package becomes enlarged to include various fields, such as indoor/outdoor illumination apparatuses, a back light unit of an LCD, a head lamp of an automobile, and so on, the LED package is required to have high luminance characteristics.

The luminance whose unit is expressed by $cd/mm^2$ is increased according to reduction in an area of a light source under the assumption that light beams have the same light flux. Therefore, in order to obtain the high-luminance LED, the light source is required to have a minimized size.

The LED package in the prior art is manufactured by mounting an LED chip into a package mold having cavities formed thereon, performing wire-bonding, and coating a light-transmissive resin on the cavities.

However, in the LED package in the prior art, reduction in the size of the cavities is limited since the LED chip together with wires are located within the cavities. In this case, since if the cavities are larger in size, the real size of a light source sensed in an optical system becomes larger. Therefore, there is a problem that the luminance is deteriorated.

SUMMARY OF THE INVENTION

The present invention has been proposed in order to overcome the above-described problems and it is, therefore, an object of the present invention to provide a light emitting diode package for reducing the size of cavities in which the LED chip is mounted, thereby improving luminance through reduction of the light source.

In accordance with one aspect of the present invention to achieve the object, there is provided a light emitting diode package including: a package mold having a first cavity and a second cavity with a smaller size than that of the first cavity; first and second electrode pads provided on the bottom surfaces of the first cavity and the second cavity, respectively; an LED chip mounted on the first electrode pad; a wire for providing electrical connection between the LED chip and the second electrode pad; and a molding material filled within the first cavity and the second cavity.

Herein, the first cavity and the second cavity are formed to have the same depth.

Also, the second cavity is formed to have a thinner depth than that of the first cavity.

Also, the first cavity and the second cavity come into contact with each other.

Also, the first cavity and the second cavity are provided to be spaced from each other.

Also, the light emitting diode package further includes a groove formed on the package mold between the first cavity and the second cavity so that a top portion of the first cavity and a top portion of the second cavity are communicated with each other.

Also, the groove has a smaller size than that of the second cavity.

Also, the groove is formed to have a thinner depth than that of the first cavity.

In accordance with another aspect of the present invention to achieve the object, there is provided a light emitting diode package including: a package mold provided with a first cavity and a plurality of second cavities with a smaller size than that of the first cavity; a plurality of first electrode pads provided to be the same number as that of the second cavities on a bottom surface of the first cavity; a second electrode pad provided on a bottom surface of the second cavities; LED chips mounted on each of the first electrode pads; wires for providing electrical connection of the LED chips and the second electrode pad; and a molding material filled in the first cavity and the second cavities.

Herein, the first cavity and the second cavities are formed to have the same depth.

Also, the second cavities are formed to have a thinner depth than that of the first cavity.

Also, the first cavity and the second cavities come into contact with one another.

Also, the first cavity and the second cavities are provided to be spaced from one another.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a plan view showing a structure of a light emitting diode package in accordance with the first embodiment of the present invention;

FIG. 2 is a cross-sectional view showing a structure of the light emitting diode package shown in FIG. 1;

FIG. 3 is a cross-section view showing the light emitting diode package in accordance with a modified example of the first embodiment of the present invention;

FIG. 4 is a plane view showing a structure of the light emitting diode package in accordance with a second embodiment of the present invention;

FIG. 5 is a cross-sectional view showing a structure of the light emitting diode package shown in FIG. 4;

FIG. 6 is a plan view showing a structure of a light emitting diode package in accordance with a third embodiment of the present invention;

FIG. 7 is a cross-sectional view taken along I-I' of FIG. 6;

FIG. 8 is a cross-sectional view taken along II-II' of FIG. 6;

FIG. 9 is a plan view showing a structure of a light emitting diode package in accordance with a fourth embodiment of the present invention; and FIG. 10 is a cross-sectional view taken along line III-III' of FIG. 9.

DETAILED DESCRIPTION OF THE PREFERABLE EMBODIMENTS

Embodiments of a light emitting diode package in accordance with the present invention will be described in detail with reference to the accompanying drawings. When describing them with reference to the drawings, the same or corresponding component is represented by the same reference numeral and repeated description thereof will be omitted.

First Embodiment

A detailed description will be given of a light emitting diode package in accordance with a first embodiment of the present invention, with reference to FIGS. 1 to 3.

FIG. 1 is a plan view showing a structure of a light emitting diode package in accordance with the first embodiment of the present invention. FIG. 2 is a cross-sectional view showing the light emitting diode package shown in FIG. 1. FIG. 3 is a cross-section view showing a light emitting diode package in accordance with a modified example of the first embodiment of the present invention.

First, as shown in FIGS. 1 and 2, the light emitting diode package 100 in accordance with the first embodiment of the present invention includes a package mold 110, a first electrode pad 120a and a second electrode pad 120b, an LED chip 130, and a wire 140.

The package mold 110 is provided with a first cavity 115a on the center thereof and a second cavity 115b with a smaller size than that of the first cavity 115a. The first and second electrode pads 120a and 120b are provided on the bottom surfaces of the first cavity 115a and the second cavity 115b, respectively. The LED chip 130 is mounted on the first electrode pad 120a of the first cavity 115a. The wire 140 is used for electrical connection of the molding part 130 and the second electrode pad 120b.

The package mold 110 provided with the cavities 115 composed of the first and second cavities 115a and 115b may be formed of a plastic material. The formation of the package mold 110 can be achieved by a general pre-molding process, and so on.

A pair of the electro pads 120 composed of the first electrode pad 120a and the second electrode pad 120b supply a current to the LED chip 130, and may be formed of a conductive material, such as Cu.

As the molding part 130 mounted on the first electrode pad 120a, GaN-based LED chip may be generally used.

The wire 140 may be formed of Au, Cu, or the like.

The first cavity 115a and the second cavity 115b are filled with a molding material 150, so the LED chip 130 and the wire 140 are protected.

The molding material 150 may be composed of a light-transmissive resin, or a light-transmissive resin containing phosphors, according to desired colors of the molding part 130 to be implemented.

As for the light-transmissive resin, a silicon resin, or an epoxy resin may be used.

The molding material 150 may be formed of the light-transmissive resin containing phosphors as described above, wherein the phosphors play a role of absorbing light of a specific wavelength, generated and emitted from the LED chip 130, and converting the absorbed light into light on a different wavelength.

The molding material 150 may be filled within the cavities 115 in the same scheme as the dispensing.

Herein, it is preferable that the first cavity 115a is formed to have a minimum size enough to mount the LED chip 130.

And, it is preferable that the second cavity 115b with a smaller size than that of the first cavity 115a is formed to have a minimum size enough to form the second electrode pad 120b bonded to the wire 140.

In this case, it is preferable that the first cavity 115a and the second cavity 115b come in contact with each other so that the length of the wire 140 can be minimized, as shown in FIG. 1.

According to the light emitting diode package of the first embodiment of the present invention, it is possible to reduce the size of the entire cavities 115 corresponding to a real size of the LED light source by forming the first cavity 115a to have a minimized size enough to mount the molding part 130, forming the second cavity 115b boned to the wire 140 electrically connected to the LED chip 130 to have a smaller size than that of the first cavity 115a at a location adjacent to the first cavity 115a.

Therefore, the light emitting diode package in accordance with the first embodiment of the present invention provides an effect capable of improving luminance through minimization of the size of the light sources.

Meanwhile, although the first cavity 115a and the second cavity 115b of the package mold 110 are formed to have the same depth, the depth of the second cavity 115b may be thinner than that of the first cavity 115a, as in a case of the light emitting diode package in accordance with the modified example of a first embodiment of the present invention shown in FIG. 3.

When the second cavity 115b is formed to have a thinner depth than that of the first cavity 115a, the bottom surface of the second cavity 115b is positioned at a higher location than that of the first cavity 115a.

Therefore, the light emitting diode package of the present invention has an advantage of preventing the damage of the wire 140, by reducing a degree at which the wire 140 boned to the second electrode pad 120b provided on the bottom surface of the second cavity 115b is bended.

Second Embodiment

A described description will be given of a light emitting diode package in accordance with a second embodiment of the present invention, with reference to FIGS. 4 and 5. A description will be given of components of the second embodiment different from those of the first embodiment, except for the description of the same components between the first and second embodiments.

FIG. 4 is a plane view showing a structure of the light emitting diode package in accordance with a second embodiment of the present invention. FIG. 5 is a cross-sectional view showing a structure of the light emitting diode package shown in FIG. 4.

As shown in FIGS. 4 and 5, the light emitting diode package 100 in accordance with a second embodiment of the present invention includes most of the same components as those of the first embodiment, only it is different from light emitting diode package of the first embodiment in that the first cavity 115a is arranged to be spaced from the second cavity 115b.

In the light emitting diode package 100 in accordance with the second embodiment of the present invention, the second electrode pad 120b bonded to the wire 140 is formed in such a manner that the second cavity 115b provided on the bottom surface thereof is separated from the first cavity 115a in which the LED chip 130 is mounted, so that it is possible to form a real size of the light source to be a size of the first cavity 115a.

That is, according to the second embodiment of the present invention, as the second cavity 115b is allowed to have no effect on optical characteristics, it is possible to reduce the real size of the light source.

Third Embodiment

A detailed description will be given of a light emitting diode package in accordance with a third embodiment of the present invention, with reference to FIGS. 6 to 8. A description will be given of components of the third embodiment different from those of the second embodiment, except for the description of the same components between the third and second embodiments.

FIG. 6 is a plan view showing a structure of a light emitting diode package in accordance with a third embodiment of the present invention. FIG. 7 is a cross-sectional view taken along I-I' of FIG. 6. FIG. 8 is a cross-sectional view taken along II-II' of FIG. 6.

As shown in FIGS. 6 and 8, the light emitting diode package in accordance with the third embodiment of the present invention includes most of the same components as those of the light emitting diode package of the second embodiment, only it is different from the light emitting diode package of the second embodiment in that a groove 160 is additionally formed on the package mold 110 between the first cavity 115a and the second cavity 115b arranged to be spaced from each other in such a manner that the top portions of the first cavity 115a and the second cavity 115b are communicated with each other.

In the third embodiment of the present invention, the groove 160 is formed between the first cavity 115a and the second cavity 115b, so that it is possible to prevent the wire 140 positioned between the first cavity 115a and the second cavity 115b from being protruded to the top portion of the package mold 110, as in a case of the second embodiment.

That is, the groove 160 aims to allow wire 140 between the first cavity 115a and the second cavity 115b to be included within the package mold 110. The groove 160 can be formed at a thinner depth than that of the first cavity 115a.

In this case, preferably, the groove 160 is formed to have a smaller size than that of the second cavity 115b, so that the groove is allowed to have no effect on the real size of the light source. That is, the groove 160 may be formed to be such a minimum size that the wire 140 can pass through the groove 160.

The inner of the groove is filled with the molding material 150, as in a case of the first cavity 115a and the second cavity 115b, so that it is possible to protect the wire 140.

Fourth Embodiment

A detailed description will be given of a light emitting diode package in accordance with a fourth embodiment of the present invention, with reference to FIGS. 9 and 10. A description will be given of components of the fourth embodiment different from those of the first embodiment, except for the description of the same components between the first and fourth embodiments.

FIG. 9 is a plan view showing a structure of a light emitting diode package in accordance with a fourth embodiment of the present invention. FIG. 10 is a cross-sectional view taken along line III-III' of FIG. 9.

As shown in FIGS. 9 and 10, the light emitting diode package 100 in accordance with the fourth embodiment of the present invention include most of the same components as those of the first embodiment, only it is different from the first embodiment in that a plurality of the second cavities 151b are formed at a portion adjacent to the first cavity 115a, the LED chips having the same number as that of the second cavities 115b are mounted in the first cavity 115a.

That is, the light emitting diode package 100 in accordance with the fourth embodiment of the present invention includes the package mold 110, a plurality of first electrode pads 120a, a second electrode pad 120b, the LED chips 130, and the wires 140. The package mold 110 is provided with the first cavity 115a and a plurality of second cavities 115b having a smaller size than that of the first cavity 115a. The first electrode pads 120a are formed to be the same number as that of the second cavities 115b, on the bottom surface of the first cavity 115a. The second electrode pad 120b is formed on the bottom surface of the second cavities 115b. The LED chips 130 are mounted on each of the first electrode pads 120a. The wires 140 are for electrically connecting the LED chips 130 to the second electrode pad 120b.

Herein, although the drawings show that all of second cavities 115b, LED chips 130, and wires 140 have formed to be four, this is for illustrative purposes, and the present invention is not limited thereto.

Although the first cavity 115a and the second cavities 115b may be formed to have a depth identical to one another as described above, the second cavities 115b may be formed to have a thinner depth than that of the first cavity 115a in order to reduce a degree at which the wires 140 are bended.

Also, the first cavity 115a and the second cavities 115b are arranged to be spaced from one another, or to come into contact to one another.

The first cavity 115a and the second cavities 115b are filled with the molding material 150, so that it is possible to protect the LED chips 130 and the wires 140.

According to the fourth embodiment of the present invention, it is possible to improve luminance by reducing the size of the light source of the light emitting diode package 100 on which a number of LED chips 130 are arranged.

As described above, according to the light emitting diode package of the present invention, it is possible to reduce a size of entire cavities, by forming a first cavity to have a minimum size enough to mount an LED chip, and forming a second cavity bonded to a wire electrically connected to the LED chip to have a smaller size than that of the first cavity at a place adjacent to the first cavity.

Therefore, the present invention provides an effect capable of improving luminance through reduction in the size of the LED light sources applied to a head lamp of an automobile.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:
1. A light emitting diode package comprising:
    a package mold having a first cavity and a second cavity having a smaller size than that of the first cavity;

first and second electrode pads provided on the bottom surfaces of the first cavity and the second cavity, respectively;

an LED chip mounted on the first electrode pad;

a wire for providing electrical connection between the LED chip and the second electrode pad; and a molding material filled within the first cavity and the second cavity, wherein the first cavity and the second cavity come into contact with each other.

2. The light emitting diode package of claim 1, wherein the first cavity and the second cavity are formed to have the same depth.

3. The light emitting diode package of claim 1, wherein the second cavity is formed to have a thinner depth than that of the first cavity.

4. A light emitting diode package comprising:

a package mold having a first cavity and a second cavity having a smaller size than that of the first cavity;

first and second electrode pads provided on the bottom surfaces of the first cavity and the second cavity, respectively;

an LED chip mounted on the first electrode pad;

a wire for providing electrical connection between the LED chip and the second electrode pad;

a molding material filled within the first cavity and the second cavity, wherein the first cavity and the second cavity are provided to be spaced apart from each other; and a groove formed on the package mold between the first cavity and the second cavity so that a top portion of the first cavity and a top portion of the second cavity are in communication with each other.

5. The light emitting diode package of claim 4, wherein the groove has a smaller size than that of the second cavity.

6. The light emitting diode package of claim 4, wherein the groove is formed to have a thinner depth than that of the first cavity.

7. The light emitting diode package of claim 4, wherein the first cavity and the second cavity are formed to have the same depth.

8. The light emitting diode package of claim 4, wherein the second cavity is formed to have a thinner depth than that of the first cavity.

9. A light emitting diode package comprising:

a package mold provided with a first cavity and a plurality of second cavities with a smaller size than that of the first cavity;

a plurality of first electrode pads provided to be the same number as that of the second cavities on a bottom surface of the first cavity;

a second electrode pad provided on a bottom surface of the second cavities;

LED chips mounted on each of the first electrode pads;

wires for providing electrical connection of the LED chips and the second electrode pad; and a molding material filled in the first cavity and the second cavities.

10. The light emitting diode package of claim 9, wherein the first cavity and the second cavities are formed to have the same depth.

11. The light emitting diode package of claim 9, wherein the second cavities are formed to have a thinner depth than that of the first cavity.

12. The light emitting diode package of claim 9, wherein the first cavity and the second cavities come into contact with one another.

13. The light emitting diode package of claim 9, wherein the first cavity and the second cavities are provided to be spaced from one another.

* * * * *